(12) United States Patent
Cox et al.

(10) Patent No.: US 11,674,991 B2
(45) Date of Patent: Jun. 13, 2023

(54) CIRCUIT-COUPLED RYDBERG SENSOR AND RECEIVER USING SAME

(71) Applicant: U.S. Army Combat Capabilities Development Command, Army Research Laboratory, Adelphi, MD (US)

(72) Inventors: Kevin C. Cox, Gate City, VA (US); David H. Meyer, Burtonsville, MD (US); Paul D. Kunz, Washington, DC (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 8 days.

(21) Appl. No.: 17/230,346

(22) Filed: Apr. 14, 2021

(65) Prior Publication Data
US 2022/0334162 A1    Oct. 20, 2022

(51) Int. Cl.
*G01R 29/08* (2006.01)
*H01Q 1/50* (2006.01)

(52) U.S. Cl.
CPC .......... *G01R 29/0885* (2013.01); *H01Q 1/50* (2013.01)

(58) Field of Classification Search
CPC .............................. G01R 29/0885; H01Q 1/50
USPC ........................................................ 324/260
See application file for complete search history.

(56) References Cited

U.S. PATENT DOCUMENTS

| 4,422,755 A | * | 12/1983 | Phillips | ............... | G03F 7/70058 |
| | | | | | 355/1 |
| 9,200,960 B2 | * | 12/2015 | McKeever | ............ | G01J 3/4338 |
| 2014/0320856 A1 | * | 10/2014 | McKeever | ............ | G01J 3/4338 |
| | | | | | 356/326 |

OTHER PUBLICATIONS

Das, Bankim Chandra, et al. "Pulse delay and group velocity dispersion measurement in V-type electromagnetically induced transparency of hot atom." Journal of Physics B: Atomic, Molecular and Optical Physics 51.24 (2018): 245501. (Year: 2018).*
Thiele, T., et al., "Imaging electric fields in the vicinity of cryogenic surfaces using Rydberg atoms," Phys. Rev. A, vol. 92, No. 6, 063425, Dec. 28, 2015, 6 pages.
Gordon, J., et al., "Rydberg Atom Electric-Field Metrology," 90th ARFTAG Conference, Boulder, Colorado, Nov. 28, 2017, NIST publications, 4 pages.
Holloway, C., et al., "Atom-Based RF Electric Field Metrology: From Self-Calibrated Measurements to Subwavelength and Near-Field Imaging," IEEE Transactions on Electromagnetic Compatibility, vol. 59, No. 2, Apr. 2017, pp. 717-728.
Sedlacek, J., et al., "Microwave electrometry with Rydberg atoms in a vapour cell using bright atomic resonances," Nature Physics, vol. 8, Nov. 2012, pp. 819-824.
Meyer, D., et al. "Digital communication with Rydberg atoms and amplitude-modulated microwave fields," Applied Physics Letters, vol. 112, No. 21, May 25, 2018, 10 pages.
Cox, K., et al. "Quantum-limited atomic receiver in the electrically small regime," Physical Review Letters, vol. 121, No. 11, Sep. 2018, 6 pages.

(Continued)

*Primary Examiner* — Christopher P McAndrew
(74) *Attorney, Agent, or Firm* — Eric B. Compton

(57) ABSTRACT

Apparatuses and methods are provided that are directed to detecting electric, magnetic, or electromagnetic fields by employing atoms excited to Rydberg states coupled to radio-frequency circuits that include waveguides.

25 Claims, 12 Drawing Sheets

(56) References Cited

OTHER PUBLICATIONS

Meyer, D., et al. "Assessment of Rydberg atoms for wideband electric field sensing," Journal of Physics B: Atomic, Molecular and Optical Physics, vol. 53, No. 3, Jan. 13, 2020, 16 pages.
Smith-Goodson, P., "Big Atoms Make Small, Super-Sensitive Quantum Receivers," Forbes, Apr. 30, 2020, 8 pages, https://www.forbes.com/sites/moorinsights/2020/04/30/big-atoms-make-small-super-sensitive-quantum-receivers/?sh=48ce188a740c.
U.S. Army Research Laboratory, "Scientists create quantum sensor that covers entire radio frequency spectrum," ScienceDaily, Mar. 19, 2020, 4 pages, https://www.sciencedaily.com/releases/2020/03/200319161529.htm.
U.S. Army CCDC Army Research Laboratory Public Affairs, "Army scientists create innovative quantum sensor," Mar. 19, 2020, 3 pages, https://www.army.mil/article/233809/army_scientists_create_innovative_quantum_sensor.
Jing, M., et al., "Atomic superheterodyne receiver based on microwave-dressed Rydberg spectroscopy," Nature Physics, vol. 16, Sep. 2020, pp. 911-921.

* cited by examiner

226 Applying a DC bias voltage to the bias connection of the radio-frequency circuit in order to help zero ambient DC fields.

228 Demodulating the output signal from the detector means, using a demodulation circuit, to produce an information signal.

Amplifying the antenna signal before it is communicated to the interface for receiving the input signal to the radio-frequency circuit.

Performing electromagnetically-induced-transparency spectroscopy using the one or more probe beams to acquire information relating to the second field and in turn the information relating to the first field.

CIRCUIT-COUPLED RYDBERG SENSOR AND RECEIVER USING SAME

GOVERNMENT INTEREST

The embodiments herein may be manufactured, used, and/or licensed by or for the United States Government without the payment of royalties thereon.

BACKGROUND

Technical Field

The embodiments herein generally relate to apparatuses and methods that employ Rydberg atoms for sensing fields, such as electric fields, magnetic fields, or both, and their applications.

Description of the Related Art

Traditional RF receivers suffer from several foundational limitations. Among these are bandwidth limitations that hinder passive receivers using resonant electrically-small antennas. Ever-increasing networking and informational demands require greater capabilities to utilize the finite spectrum.

To enhance the capabilities for the utilization of the available spectrum, the use of quantum sensors for radio-frequency (RF) electromagnetic fields has been suggested. However, prior, non-cryogenic quantum RF sensors do not match the sensitivity of traditional receivers that use antennas and standard electronics. Heretofore, Rydberg sensor platforms have been one hundred times less sensitive than standard RF receivers. In addition, the sensitivity of these sensors is limited by internal thermal noise. Accordingly, there is a need for quantum sensor systems that can overcome the sensitivity, bandwidth, and precision limitations of standard RF sensors and prior quantum-sensor-based systems.

SUMMARY

The embodiments disclosed herein provide for small, room-temperature, ensemble-based Rydberg sensors that surpass the sensitivity, bandwidth, and precision limitations of standard RF sensors, receivers, and analyzers and those of Rydberg sensor platforms known heretofore. The embodiments disclosed herein employ atoms excited to Rydberg states that are coupled to a radio-frequency (RF) circuit to provide sensors, receivers, and analyzers that have bandwidth, sensitivity, and precision characteristics that are superior to standard electronic and Rydberg sensor systems known heretofore.

Some of the embodiments disclosed herein are directed to apparatuses for detecting a first field. In one example, the apparatus comprises a chamber, a radio-frequency circuit, one or more lasers configured to provide one or more laser beams that include one or more probe beams, and one or more photo-sensors configured to detect at least the one or more probe beams. The chamber contains a vapor comprising atoms of at least one element. The radio-frequency circuit comprises a waveguide. The radio-frequency circuit also includes an interface for receiving an input signal having at least one component corresponding to the first field. The input signal to the radio-frequency circuit results in a second field. The waveguide is located in relation to the chamber such that at least some of the vapor and at least a portion of the second field are co-located in a co-location zone within the chamber. Laser beams excite atoms in the vapor to Rydberg states. The laser beams include probe beams that acquire deviations in one or more of their characteristics as a result of passing through the co-location zone. The probe beams are detected by the one or more photo-sensors to produce an output signal that is indicative of information relating to the first field.

Some of the embodiments disclosed herein are directed to methods for detecting a first field. A method for detecting a first field, according to an embodiment herein, includes providing a chamber containing a vapor comprising atoms of at least one element. The method also includes providing a radio-frequency circuit comprising a waveguide. The method also includes providing an input signal to the radio-frequency circuit, wherein the input signal to the radio-frequency circuit relays information relating to the first field. The input signal to the waveguide results in a second field at least within a zone of influence of the waveguide. The method also includes arranging for the waveguide to be located in relation to the chamber such that at least some of the vapor and at least a portion of the second field are co-located in a co-location zone within the chamber. The method also includes directing one or more laser beams through the co-location zone to excite at least some of the atoms of the at least one element in the vapor within the co-location zone within the chamber to one or more Rydberg states. The one or more laser beams include one or more probe beams. At least each of the one or more probe beams acquires one or more deviations in one or more of their physical properties as a result of passing through the co-location zone 120 that relays information relating to the second field. The method also includes detecting at least the one or more probe beams using one or more photo-sensors configured to detect at least the one or more probe beams.

These and other aspects of the embodiments herein will be better appreciated and understood when considered in conjunction with the following description and the accompanying drawings. It should be understood, however, that the following descriptions, while indicating exemplary embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIGS. 9-14 are flow diagrams illustrating additional method steps for use with the embodiments herein.

DETAILED DESCRIPTION

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

Figure 1:
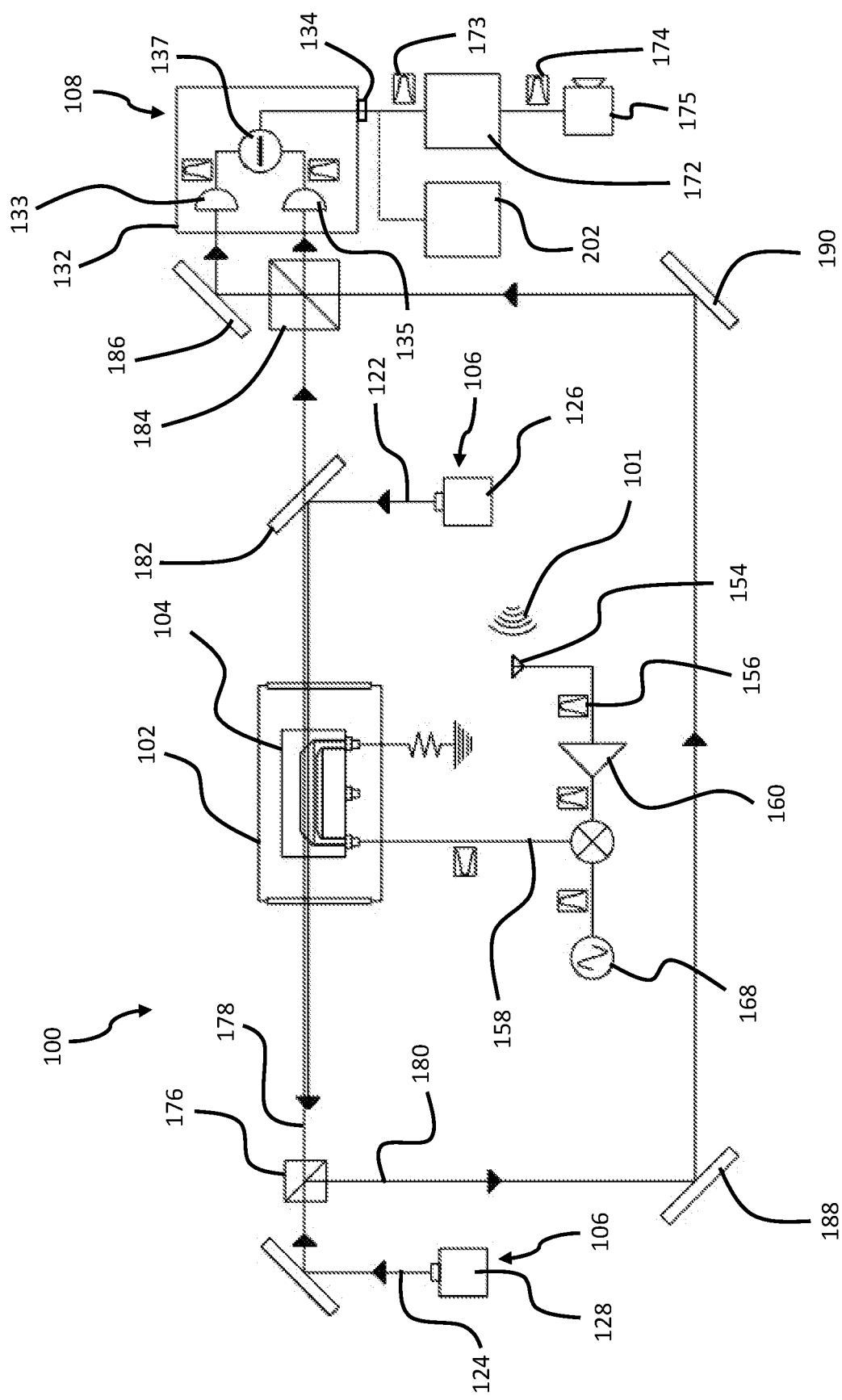
FIG. 1 is a schematic diagram illustrating an apparatus in accordance with an example embodiment disclosed herein.
Figure 2:
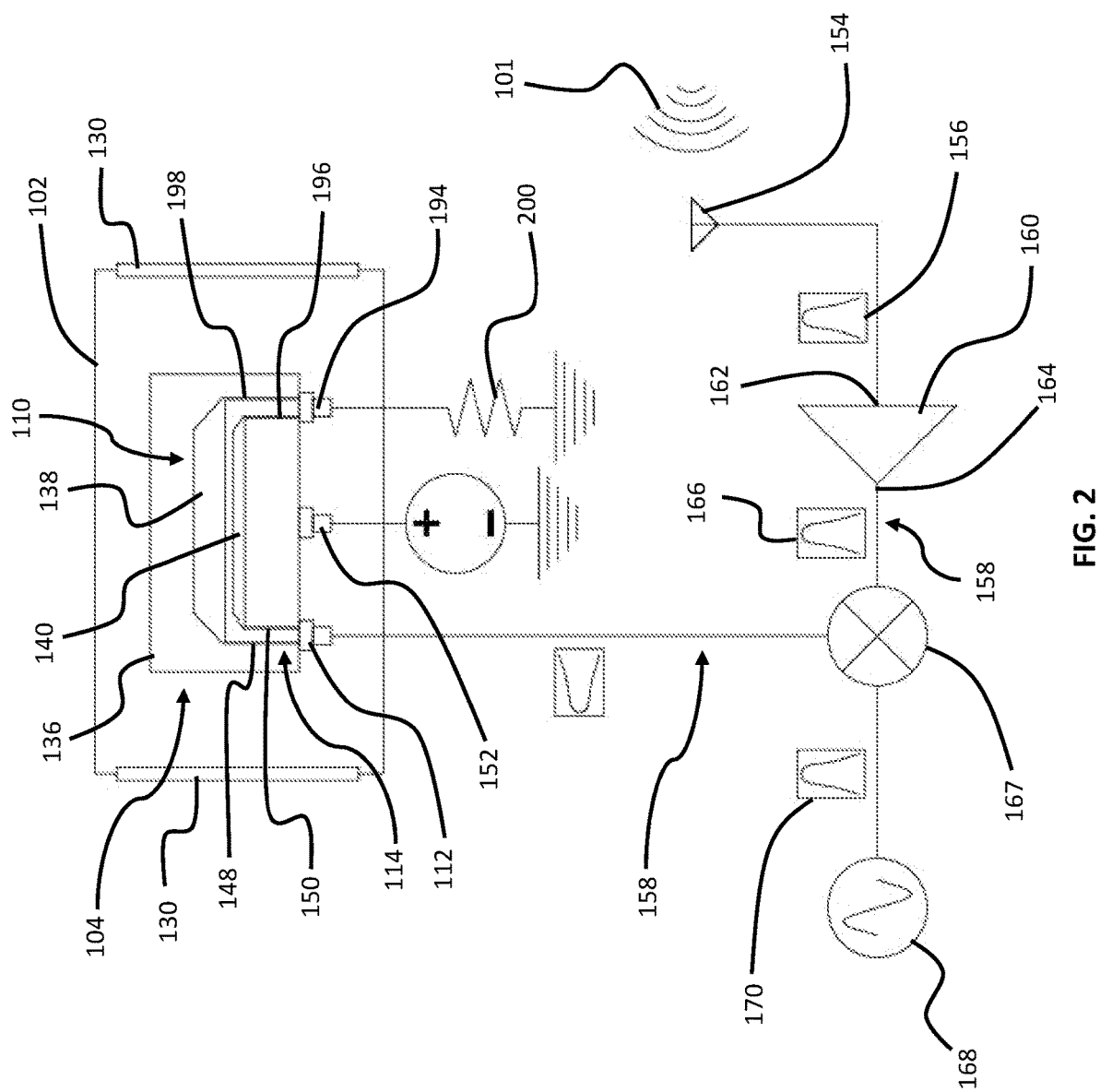
FIG. 2 is a schematic diagram illustrating a first example of a radio-frequency circuit and waveguide that is capable of being used with the embodiments disclosed herein.
Figure 3:
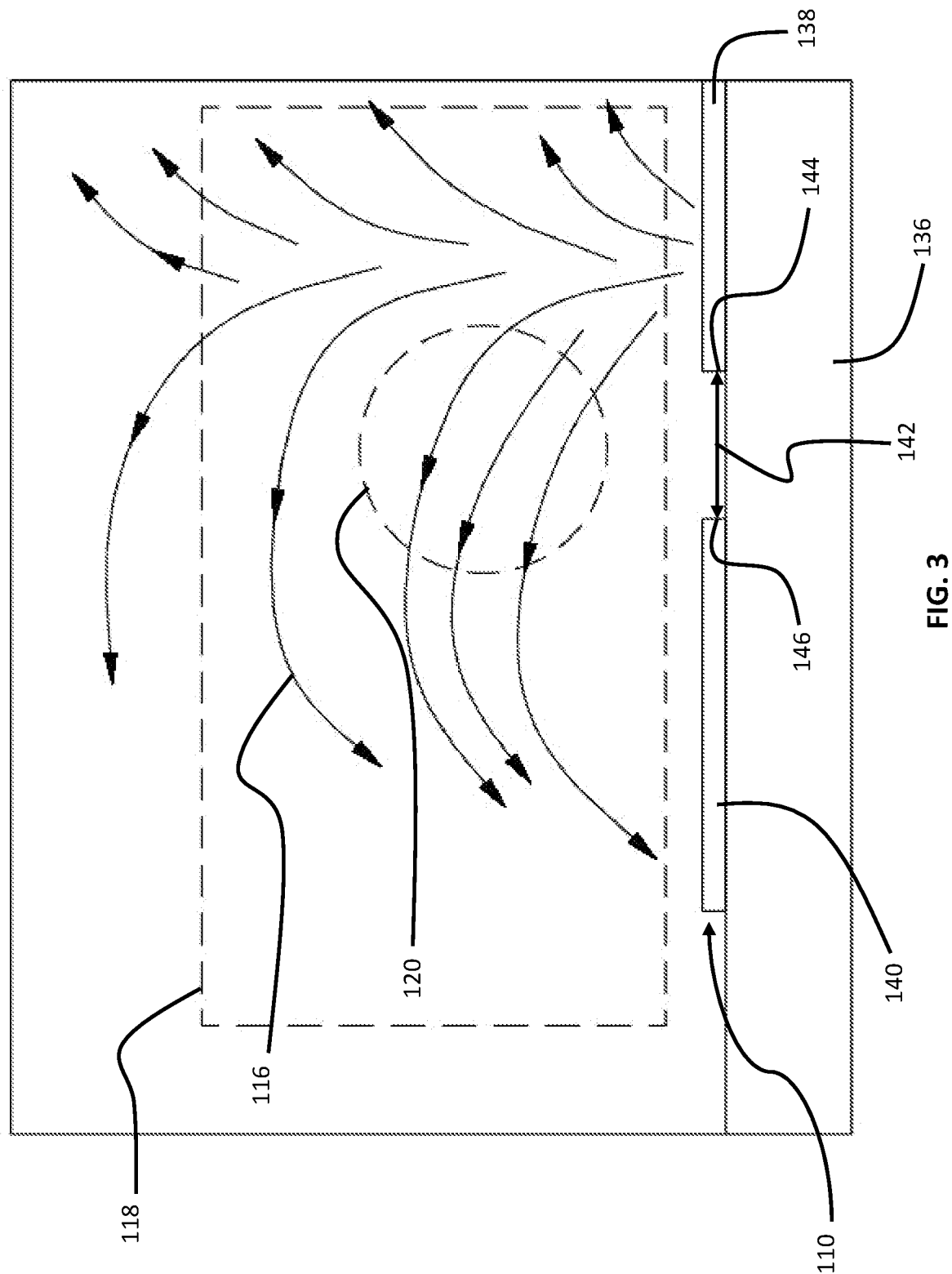
FIG. 3 is a fragmentary, schematic diagram illustrating the second field created by the waveguide of FIG. 2.

Referring to FIGS. 1-3, the embodiments disclosed herein include an apparatus 100 for detecting a first field 101. The first field 101 may be an electric field, a magnetic field, or an electromagnetic field, which is a combination of electric and magnetic fields. In some examples, the first field being detected may be static, in other words time-invariant, while in other examples, the first field may be fluctuating. In some examples, the first field may be the result of radio-frequency (RF) electromagnetic radiation emanating from a remotely located source. In some examples, the first field may be due to a broadcast signal in the form of RF radiation, where the broadcast signal comprises a carrier signal modulated to carry analog or digital information such as, for example, voice, video, or data. Examples of signals that can be detected by the embodiments herein include, but are not limited to, television broadcasts, cellular communication signals, satellite communication signals, RADAR signals, microwave communication signals, FM radio, AM radio, Wi-Fi, Bluetooth signals and any other forms of electromagnetic emissions. The embodiments herein are capable of detecting weak ambient signals.

The apparatus 100 comprises a chamber 102, a radio-frequency circuit 104, laser beam means 106, and detector means 108. The chamber 102 contains a vapor comprising atoms of at least one element. The vapor may be elemental or made of a compound. The vapor may be molecular or atomic. The element in the vapor must be capable of being excited to one or more Rydberg states by a laser. In some embodiments herein, the vapor is an atomic vapor of an element selected from the alkali metals. In some embodiments herein, the vapor is an atomic vapor of at least the atoms of the at least one element, and the at least one element is selected from the group consisting of rubidium and cesium.

The radio-frequency circuit 104 comprises a waveguide 110. The radio-frequency circuit 104 also includes an interface 112 for receiving an input signal having at least one component corresponding to the first field 101. The interface 112 communicates with the input 114 to the waveguide 110. The input signal to the radio-frequency circuit 104 is conducted to the waveguide 110. The input signal to the radio-frequency circuit 104 relays information relating to the first field 101. The input signal to the radio-frequency circuit 104 results in a second field 116 at least within a zone of influence 118 of the waveguide 110. The waveguide 110 is located in relation to the chamber 102 such that at least some of the vapor and at least a portion of the second field 116 are co-located in a co-location zone 120 within the chamber 102. The co-location zone 120 lies at least in part within the zone of influence 118 of the waveguide 110.

The laser beam means 106 provides one or more laser beams 122, 124, which are configured to provide atomic excitation of at least some of the atoms of the at least one element in the vapor within the co-location zone 120 within the chamber 102 to one or more Rydberg states. In the illustrated example, the one or more laser beams 122, 124 are provided by lasers 126, 128, respectively. The one or more laser beams 122, 124 are further configured to provide one or more probe beams 124 passing through the co-location zone 120 within the chamber 102. At least each of the one or more probe beams 124 acquires one or more deviations in one or more of its physical characteristics as a result of passing through the co-location zone 120 and thus relays or carries information relating to the second field after it passes through the co-location zone 120. In some embodiments, at least each of the one or more probe beams 124 acquires one or more of a phase deviation and an amplitude deviation as a result of passing through the co-location zone 120 and thus relays or carries information relating to the second field after it passes through the co-location zone 120.

The detector means 108 is configured to detect at least the one or more probe beams 124. The detector means 108 comprises at least one photo-detection element 132 and an output port 134. The detector means 108 is configured to produce an output signal 173 at its output port 134 that provides information corresponding to at least a portion of the information relating to the second field 116 that in turn corresponds to at least a portion of the information relating to the first field 101. Accordingly, the one or more photo-sensors 133 and 135, and in turn the photo-detection element 132, are configured to provide a photo-detection output signal 173 at the photo-detection output port 134 that provides information corresponding to at least a portion of the information relating to the second field 116 that in turn corresponds to at least a portion of the information relating to the first field 101. The term port as used herein simply refers to a conductor for carrying an input or output signal. In some embodiments herein, the conductor forming the port may be part of a connection jack or interface. The chamber 102 has one or more transparent portions 130, or may be transparent in whole or in part, to allow the one or more laser beams 122, 124 to traverse the co-location zone 120 within the chamber 102.

While the embodiments disclosed herein are not and should not be limited by any theory of operation of the various disclosed embodiments, it is believed that the one or more laser beams 122, 124 excite the vapor atoms to various Rydberg states, and the atoms excited to the Rydberg states form dipoles that then move and/or orient and and/or change states in ways that are influenced by the second field 116 and that correspond to the physical characteristics of the second field 116 such as, for example, the intensity or strength of the field, the direction or polarity of the field, the spectral composition of the field, and changes in the field. Accordingly, the ways in which the atoms in the Rydberg states move and/or orient and and/or change states are indicative of information relating to the second field 116. When at least one probe beam 124 passes through the co-location zone 120, it interacts with the excited atoms in the Rydberg states, which results in changes to one or more of the phase, amplitude, frequency, intensity, and any other characteristic of the probe beam 124. The changes in the probe beam 124 are also indicative of information relating to the second field 116. The one or more probe beams 124 are distinguished from the other laser beams only by the fact that the probe beams are the ones detected by the detector means 108. Accordingly, the changes in the one or more probe beams 124 cause changes in the output signal 173 of the detector means 108 at the output port 134. Thus, the detector means 108 provides an electrical output signal 173 that carries information indicative of information relating to the second field 116. As the second field 116 results from a signal containing information corresponding to characteristics of the first field 101, the output of the detector means 108 will also provide an electrical output signal 173 that carries information indicative of information relating to the first field 101.

The one or more laser beams 122, 124 are of wavelengths selected to lead to an excitation of some of the vapor atoms to one or more Rydberg states with high principle quantum numbers. The selected wavelengths may include, but are not limited to, possible excitation wavelengths for the alkali metal atoms. In some embodiments, the one or more laser beams 122, 124 each have a wavelength in a range from about 400 nm to about 1600 nm. In some embodiments, the one or more laser beams 122, 124 each have a wavelength selected from the group consisting of about 780 nm, about 480 nm, about 1430 nm, about 776 nm, about 852 nm, about 1324 nm, about 1367 nm, about 510 nm, about 795 nm, about 894 nm, about 496 nm, about 781 nm, and about 1469 nm.

The waveguide 110 may comprise one or more wave guides selected from the group of waveguides consisting of waveguides comprising parallel conductive strips, parallel wire waveguides, strip lines, and dielectric resonators.

Figure 4:
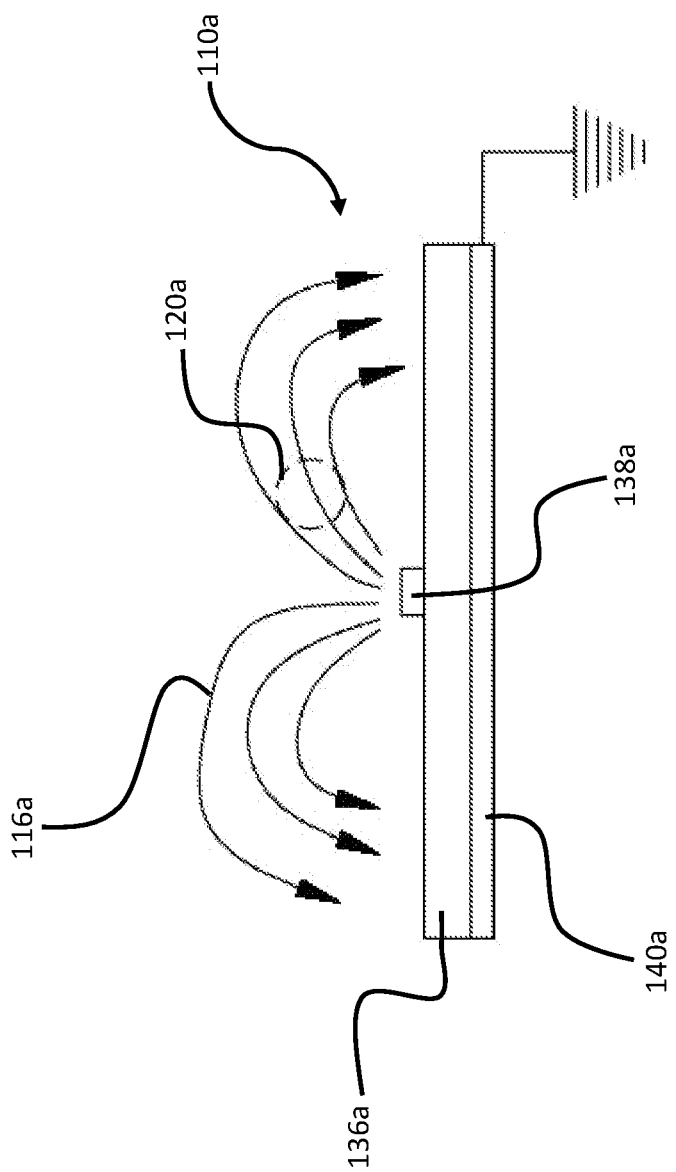
FIG. 4 is a schematic diagram illustrating a second example of a radio-frequency circuit and waveguide, called a stripline waveguide that is capable of being used with the embodiments disclosed herein.

Referring to FIG. 4, an example of a strip line resonator or waveguide 110a used with some of the embodiments herein can be seen. In a strip line resonator, field lines representing the electric field 116a emanate from one or more conductors 138a and proceed through the board or substrate material 136a to a ground plane 140a that is used as a return path. The atoms excited to the one or more Rydberg states within the co-location zone 120a couple the one or more probing lasers to the electric field 116a.

Figure 5:
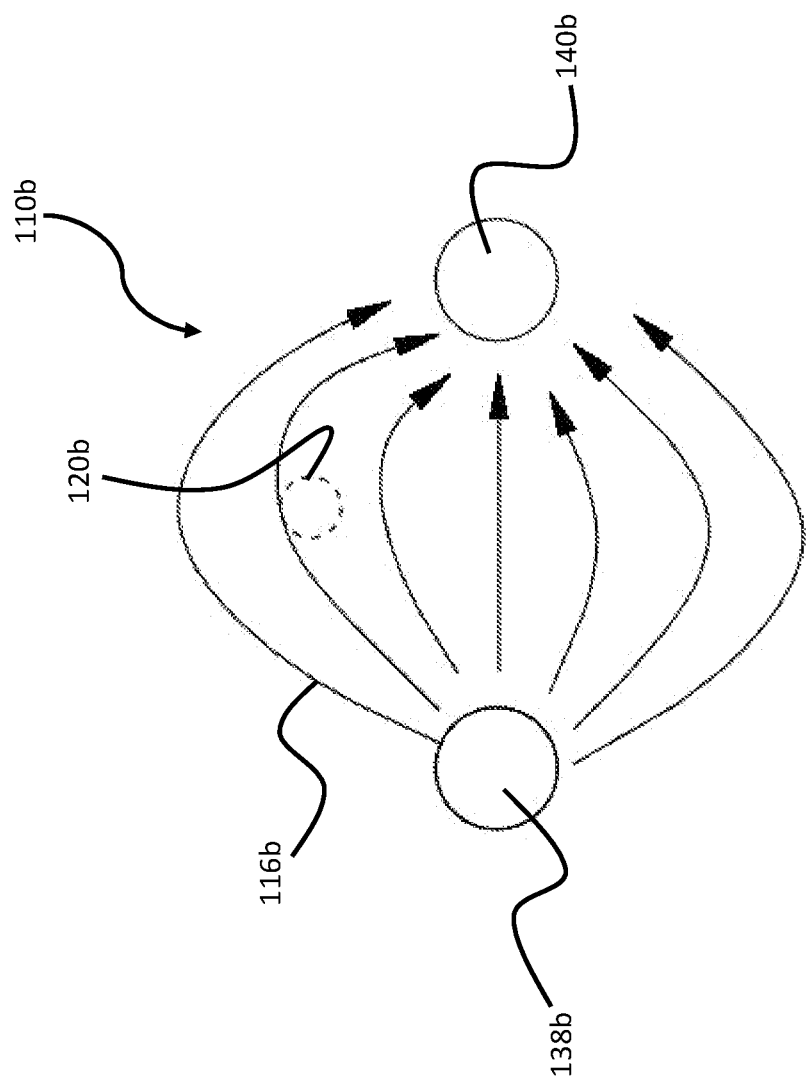
FIG. 5 is a schematic diagram illustrating a third example of a radio-frequency circuit and waveguide, called a parallel conductor waveguide that is capable of being used with the embodiments disclosed herein.

Referring to FIG. 5, an example of a parallel wire waveguide 110b used with some of the embodiments herein can be seen. In the parallel wire waveguide 110b, no dielectric or circuit board is used, to minimize losses and the dielectric constant. Atoms, which are to be excited to the Rydberg states, are placed at a location among the two or more wires 138b and 140b, to maximize the coupling with the electric field 116b. The atoms excited to the one or more Rydberg states within the co-location zone 120b couple the one or more probing lasers to the electric field 116b.

Figure 6:
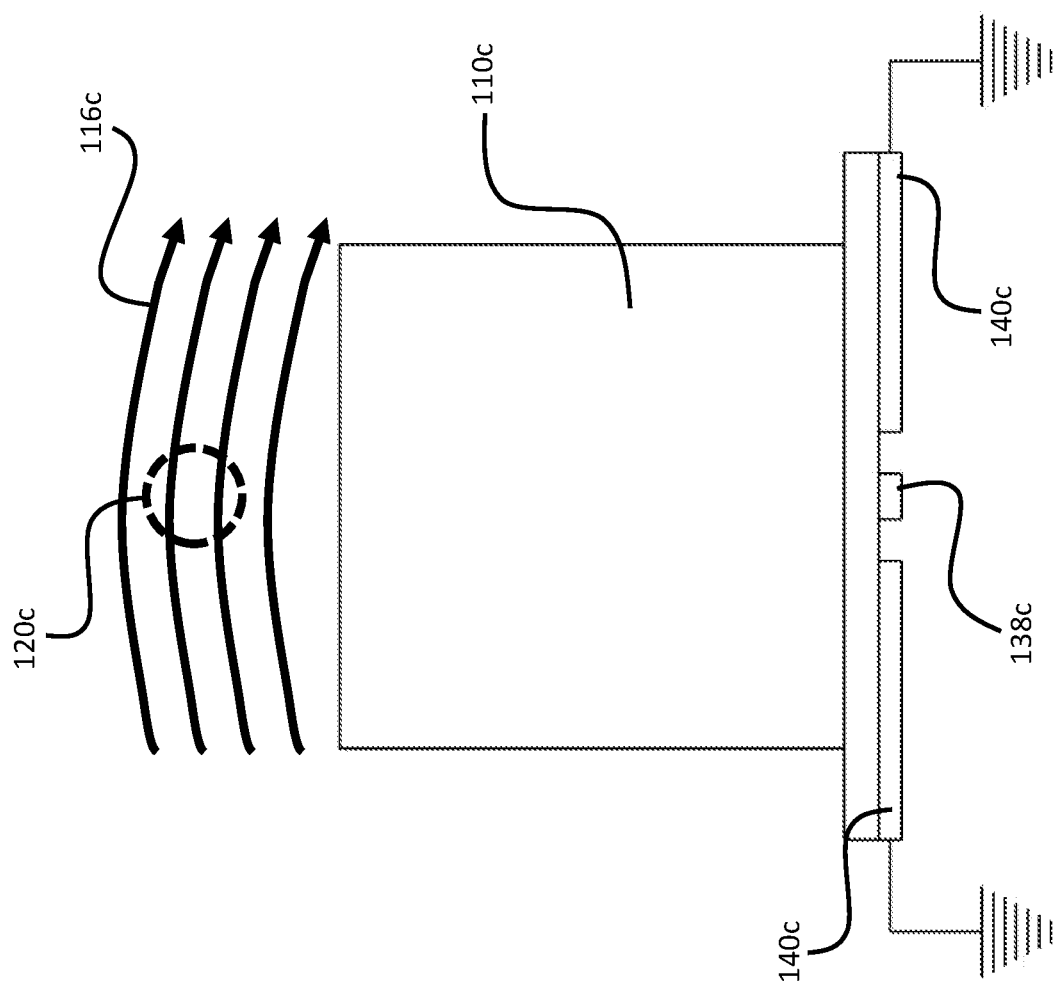
FIG. 6 is a schematic diagram illustrating a fourth example of a radio-frequency circuit and waveguide, called a dielectric resonator or dielectric antenna that is capable of being used with the embodiments disclosed herein.

Referring to FIG. 6, an example of a dielectric resonator or antenna 110c used with some of the embodiments herein can be seen. In a dielectric resonator 110c, the field lines representing the electric field 116c emanate from the block of dielectric material forming the resonator/antenna 110c, which is excited by one or more signal conductors 138c working cooperatively with the ground plane 140c. The atoms excited to the one or more Rydberg states within the co-location zone 120c couple the one or more probing lasers to the electric field 116c. In the illustrated example, the dielectric resonator/antenna 110c is in the form of a rectangular block, but the dielectric resonator/antenna may also be in other forms such as, for example, a right circular cylinder and an elliptical cylinder among others.

Figure 7:
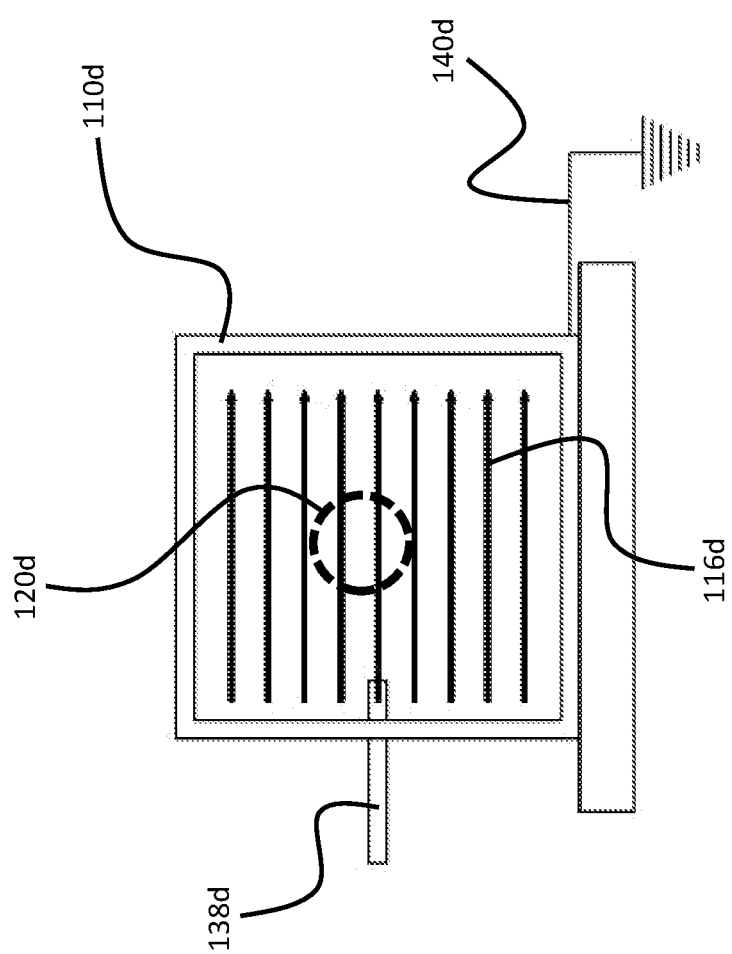
FIG. 7 is a schematic diagram illustrating a fifth example of a radio-frequency circuit and waveguide, called a hollow conductive waveguide or resonator that is capable of being used with the embodiments disclosed herein.
Figure 8:
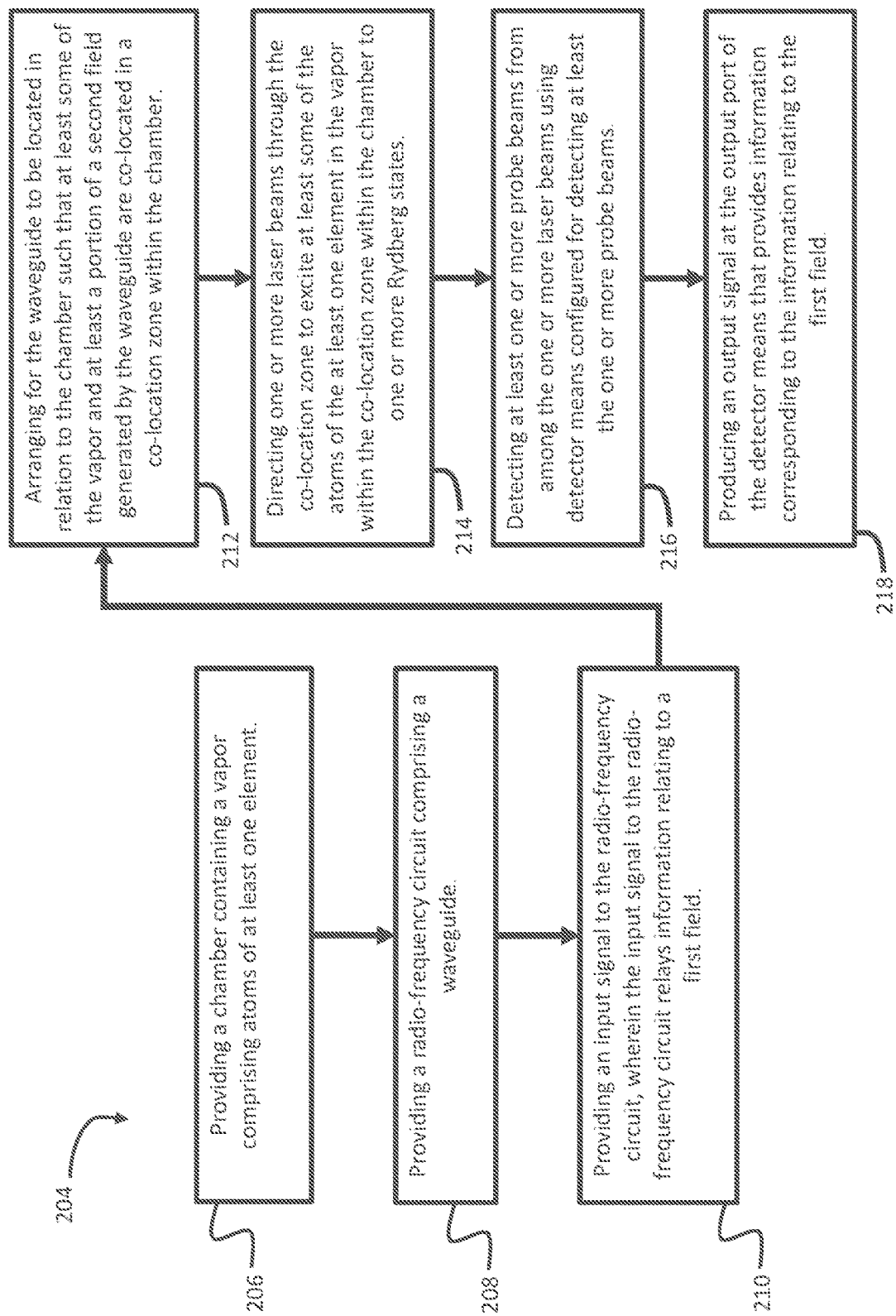
FIG. 8 is a flow diagram illustrating a method for detecting a field in accordance with the embodiments herein.
Figure 9:
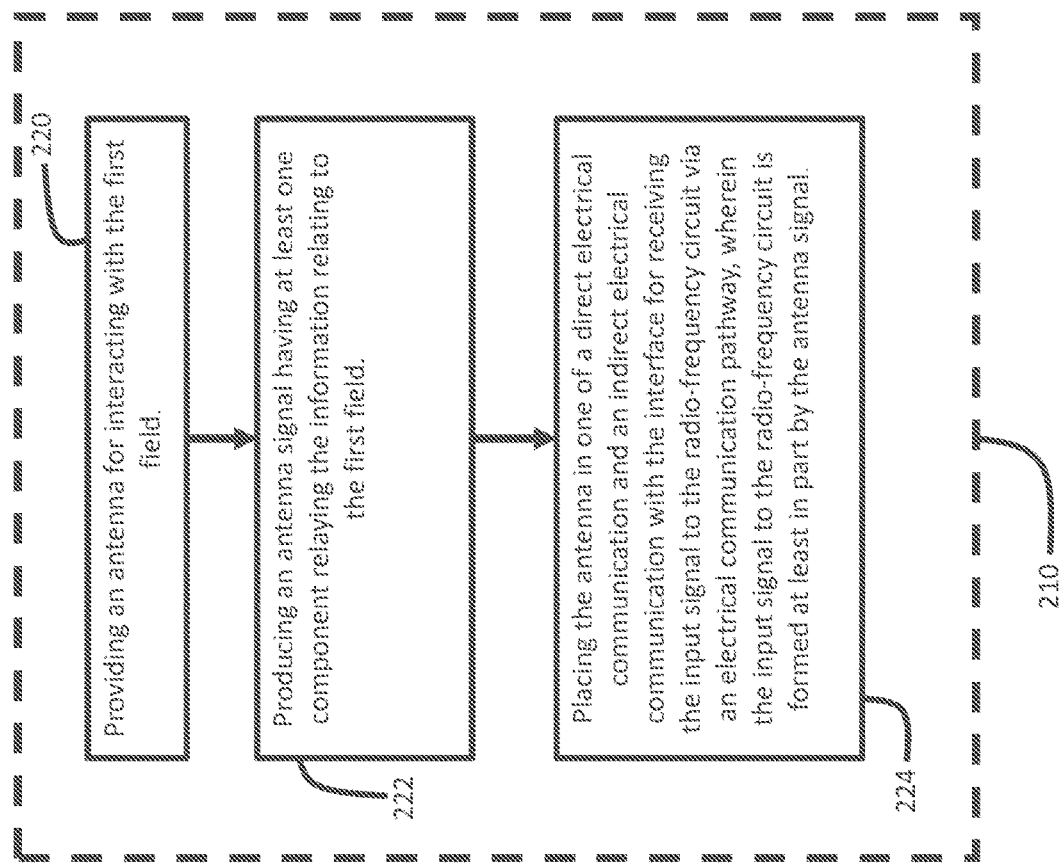
Figures 10, 11:
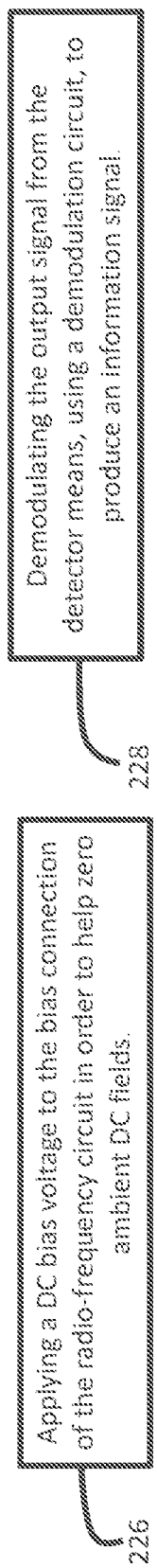
Figure 12:
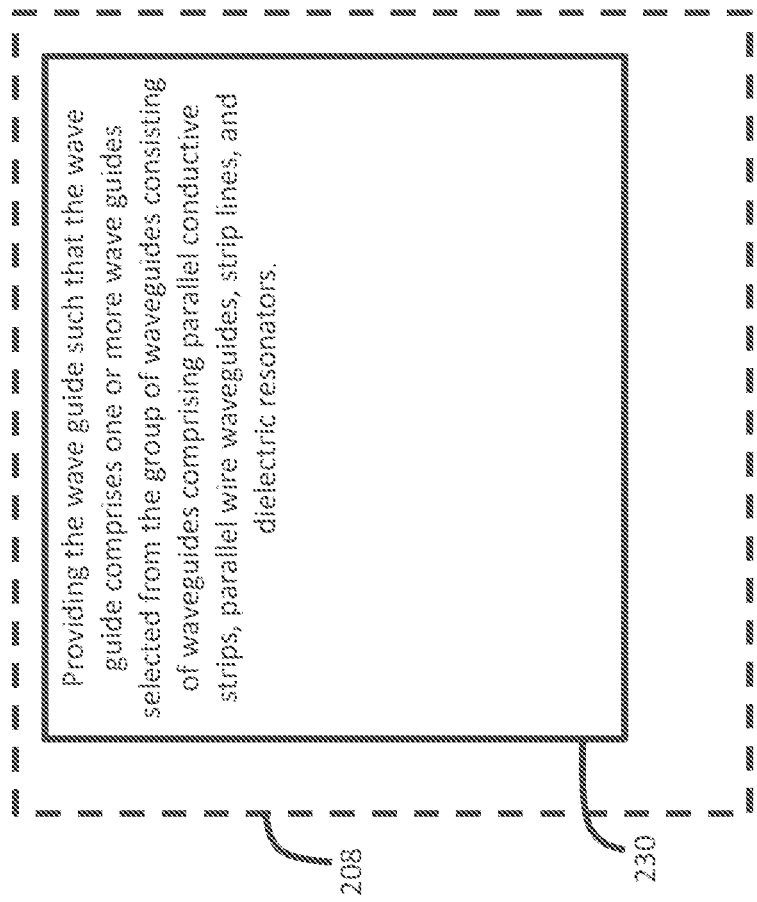

Referring to FIG. 7, an example of a hollow conductive resonator or waveguide 110d used with some of the embodiments herein can be seen. In a hollow, conductive waveguide 110d, the field lines representing the electric field 116d are at least partly confined within the hollow, conductive waveguide 110d, which is excited by one or more signal probes 138d working cooperatively with the ground 140d. There is no electrically conductive contact between the probe 138d and the hollow waveguide 110d. The atoms excited to the one or more Rydberg states within the co-location zone 120d couple the one or more probing lasers to the electric field 116d. In the illustrated example, the hollow waveguide 110d has a rectangular cross section, but the hollow waveguide may also have other cross sections such as, for example, circular and an elliptical cross sections among others. The various types of waveguides employed in the embodiments herein may be operated in both the resonant and wide-band modes without departing from the scope of the embodiments disclosed herein.

In some embodiments herein, the waveguide 110 comprises a substrate 136, a first conductive strip 138, and a second conductive strip 140. The first conductive strip 138 and the second conductive strip 140 are provided on the same surface of the substrate 136. Each of the first conductive strip 138 and the second conductive strip 140 has a predetermined length.

There is a gap 142 between the first conductive strip 138 and the second conductive strip 140. At least an edge 144 of the first conductive strip 138 on a first side of the gap 142 is parallel to at least an edge 146 of the second conductive strip 140 on a second side of the gap 142 over at least a portion of the length of the first conductive strip 138 and at least a portion of the length of the second conductive strip 140. The second side of the gap 142, which is defined by the edge 146 of the second conductive strip 140, is opposite the first side of the gap 142, which is defined by the edge 144 of the first conductive strip 138.

The first conductive strip 138 serves as a signal trace and the second conductive strip 140 serves as a ground plane. The atoms excited to the one or more Rydberg states are generated within the co-location zone 120, which is located in proximity to the gap 142 between the first conductive strip 138 and the second conductive strip 140.

The input or interface 112 for receiving the input signal to the radio-frequency circuit 104 has a signal connection 148 and a ground connection 150. The first conductive strip 138 is conductively connected to the signal connection 148 of the interface 112 for receiving the input signal to the radio-frequency circuit 104. The second conductive strip 140 is conductively connected to the ground connection 150 of the interface 112 for receiving the input signal to the radio-frequency circuit 104.

The gap 142 between the first conductive strip 138 and the second conductive strip 140 may be in the range of from about 1 µm to about 20 mm. In some embodiments, the gap 142 between the first conductive strip 138 and the second conductive strip 140 may be in the range of from about 100 µm to about 5 mm. In the illustrated embodiment, the gap 142 between the first conductive strip 138 and the second conductive strip 140 is about 2 mm.

In some embodiments disclosed herein, the apparatus 100 further comprises a substrate bias connection 152 configured to allow a DC bias voltage to be applied to the substrate 136 in order to help zero ambient DC fields.

In some example embodiments herein, the apparatus 100 further comprises an antenna 154 for interacting with the first field 101 and producing an antenna signal 156 having at least one component relaying the information relating to the first field 101. The antenna 154 is in direct electrical communication or in indirect electrical communication with the interface 112 for receiving the input signal to the radio-frequency circuit 104 via an electrical communication pathway 158. The input signal to the radio-frequency circuit 104 is formed at least in part by the antenna signal 156.

In some embodiments disclosed herein, the apparatus 100 further comprises a preamplifier 160 provided in the electrical communication pathway 158 between the antenna 154 and the interface 112 for receiving the input signal to the radio-frequency circuit 104 for strengthening the antenna signal 156 before it is communicated to the interface 112 for receiving the input signal to the radio-frequency circuit 104. The preamplifier 160 has at least one input 162 for receiving the antenna signal 156 and at least one output 164 for outputting a preamplifier output signal 166. The preamplifier output signal 166 provides at least a part of the input signal to the radio-frequency circuit 104.

In some embodiments disclosed herein, the apparatus 100 further comprises a local oscillator 168, which provides a local oscillator signal 170. The local oscillator 168 is electrically connected to the electrical communication pathway 158 between the preamplifier 160 and the interface 112 for receiving the input signal to the radio-frequency circuit 104 such that the preamplifier output signal 166 is mixed, using a mixer 167, with the local oscillator signal 170 to provide at least a part of the input signal to the radio-frequency circuit 104 for enhancing the sensitivity of the apparatus 100 for detecting the information relating to the first field 101.

In some embodiments herein, the first field 101 may be due to modulated signals. In such embodiments, the first field 101 is the result of a carrier signal modulated using some modulation scheme, including but not limited to frequency modulation, amplitude modulation, and phase modulation, to carry information including, but not limited to, audio, video, and data. In some embodiments herein, the first field 101 may be due to unmodulated signals as is the case in some digital communication signals for example. In the case of digital communications, the information is very often data. "Communication information" as used herein includes, without limitation, audio, video, and data for example.

In some embodiments disclosed herein, the apparatus 100 is a receiver for modulated signals, and the first field 101 is a first fluctuating field having one or more frequencies in the radio frequency range. Also, the second field 116 is a second fluctuating field. The information relating to the first field 101 includes communication information relayed by the first fluctuating field. The apparatus 100 further comprises a demodulation circuit 172 that is electrically communicating with the detector means 108 for receiving the output signal 173 from the detector means 108 and for producing an information signal 174 containing information corresponding to the communication information contained in the first fluctuating field 101 based at least in part upon the output signal 173 from the detector means 108. The information signal 174 may, for example, contain audio supplied to the speaker 175.

In some embodiments disclosed herein, the apparatus 100 is a receiver for unmodulated signals, and the apparatus 100 further comprises a base band receiver 202 that is electrically communicating with the detector means 108 for receiving the output signal 173 from the detector means 108 and extracting information contained in the first fluctuating field 101 based at least in part upon the output signal 173 from the detector means 108.

In the illustrated embodiment of FIG. 1, the apparatus 100 may be used for detecting a first fluctuating field 101 having one or more frequencies in the radio frequency range. The apparatus 100 comprises a chamber 102 containing a vapor comprising atoms of at least one element and a radio-frequency circuit 104 comprising a waveguide 110 that is located within the chamber 102. The radio-frequency circuit 104 includes an interface 112 for receiving a radio-frequency circuit 104 input signal 103 having at least one component corresponding to the first fluctuating field 101. The radio-frequency circuit 104 input signal results in a second fluctuating field 116 within the chamber 102 near the waveguide 110. The second fluctuating field 116 includes information that correspond to the information in the first fluctuating field 101.

In the illustrated embodiment, the laser beam means 106 includes two lasers 126 and 128 that provide two laser beams 122 and 124. Accordingly, the one or more laser beams are the two laser beams 122 and 124, and the one or more probe beams are one probe beam 124. The two laser beams 122 and 124 provide for excitation of the atoms in the chamber 102 to one or more Rydberg states as the laser beams 122 and 124 pass through the second fluctuating field 116 within the chamber 102 in proximity to the waveguide 110, corresponding to the co-location zone 120. The probe beam 124 acquires changes, for example deviations in one or more of the phase, amplitude, frequency, and intensity, as the probe beam 124 passes through the co-location zone 120 containing the excited atoms in the Rydberg states on its way to the detector means 108.

The changes in the probe beam 124 correspond to the information in the second fluctuating field 116 that in turn correspond to the information in the first fluctuating field 101. Accordingly, the changes in the probe beam 124 correspond to the information in the first fluctuating field 101. The detector means 108 is configured to detect the probe beam 124 both with and without the changes caused by passage of the probe beam 124 through the co-location zone 120 that has in it the excited atoms in the Rydberg states within the chamber 102. In the illustrated embodiment, the detector means 108 comprises a photo-detection element 132 that includes photo-sensor elements 133 and 135, a subtractor circuit 137, and an output port 134.

As seen in FIG. 1, the detector means 108 subtracts the photo-sensor element signals, one of which is due to the probe laser beam having changes caused by passage of the probe beam 124 through the co-location zone 120 and the other of which is due to the probe laser beam without those changes, to provide the output signal 173 that is indicative only of the changes induced in the probe beam 124 by the second field 116 coupled with the excited atoms in the Rydberg states. Thus, the detector means 108 produces an output signal 173 at its output port 134 that provides information corresponding to the information relating to the second field 116. In turn, at least a portion of the information relating to the second field 116 corresponds to the information relating to the first field 101.

The probe laser beam 124 is split by an optical beam splitter 176 so as to proceed along two paths 178 and 180. The portion of the probe beam 124 directed along the path 178 traverses the co-location zone 120 within the chamber 102 and is directed through the optical filter 182 and, by beam splitter 184 and mirror 186, to the photo-sensor elements 133 and 135. The portion of the probe beam 124 directed along the path 180 bypasses the chamber 102 and is directed, by mirrors 188, 190, and 186, and beam splitter 184, to the photo-sensor elements 133 and 135. The subtractor circuit 137, which may be an op amp subtractor for example, has an inverting input (not shown) and a non-inverting input (not shown). The output signal from one of the photo-sensor elements 133, 135 is fed to the inverting input of the subtractor 137, while the output signal from the other one of the photo-sensor elements 133, 135 is fed to the non-inverting input of the subtractor 137. Accordingly, the resulting output signal 173 of the detector means 108 corresponds to the difference between the output signal from the photo-sensor element 133 and the output signal from the photo-sensor element 135. Therefore, the resulting output signal 173 of the detector means 108 reflects the changes induced in the probe beam 124 by the second field 116 coupled with the excited atoms in the Rydberg states.

The purpose of the optical heterodyne detection scheme embodied in FIG. 1 is to sensitively measure the relative phase between the probe laser 178 and the reference beam 180. The two laser beams are overlapped on the beam splitter 184. The common-mode fluctuations of the two laser beams are suppressed by the difference operation performed on the outputs of the photo-sensor elements 133, 135 by the subtractor 137, but critically, information about the atomic signal is retained. Alternatively, other detection methods may also be used such as, for example, an optical homodyne detection scheme.

The chamber 102 has one or more transparent portions 130 to allow the laser beams 122 and 124 to traverse the co-location zone 120 within the chamber 102. The non-probe laser beam 122 is a laser beam having a wavelength of about 480 nm, and the probe beam 124 is a laser beam having a wavelength of about 780 nm. In the illustrative embodiment, the vapor in the chamber 102 is an atomic vapor of rubidium.

In some embodiments herein, the radio-frequency circuit 104 may include a terminating interface 194. The terminating interface 194 has a ground connection 196 connected to the conductive strip 140 and a signal connection 198 connected to the conductive strip 138. The ground connection 196 is grounded, and the signal connection 198 is connected to the ground via a terminal 50 ohm resistor 200.

"Information" as used herein includes, but is not limited to, existence or presence of a field; one or more physical characteristics of the field including without limitation the intensity or strength of the field, the direction or polarity of the field, the frequency, the amplitude, the phase, the spectral makeup of the field, and changes or fluctuations in the field; audio, video, and data carried by a modulated carrier signal; and data carried by an unmodulated signal. "Data" includes all types of data including digital audio and video. "Proximate" and "proximity" as used herein in reference to spatial location means being located at or near the reference location.

In some embodiments herein, the local oscillator 168 is configured such that the frequency of the local oscillator signal 170 is capable of being scanned over a scannable frequency range. The local oscillator 168 is used to boost detection within a frequency range around the frequency of the local oscillator signal 170. The frequency of the local oscillator signal 170 is scanned such that the apparatus 100 may perform continuous spectrum analysis over the scannable frequency range. In some embodiments herein, the scannable frequency range is from about 0 Hz up to about 1 THz. In some embodiments herein, the scannable frequency range is from about 0 Hz up to about 100 GHz. In some embodiments herein, the scannable frequency range is from about 0 Hz up to about 40 GHz. In some embodiments herein, the scannable frequency range is from about 0 Hz up to about 20 GHz.

The apparatus 100 is capable of being used as an ultra-sensitive receiver that surpasses the thermal noise limit, by performing atomic spectroscopy below the thermal noise limit. The apparatus 100 is used to achieve a high measurement bandwidth, not limited by the Chu limit or any fundamental quantum mechanical limitations. The apparatus 100 is capable of providing spectral awareness in the radio-frequency spectrum for frequencies within the scannable ranges provided above. The Chu limit is a well-known limit to small antennas that limit's their resonant quality factor Q, to a value greater than $1/(k^3 a^3)$ where a is the radius of an enclosing sphere that encompasses the antenna, and $k=2\pi/\lambda$ is the wavenumber of the resonant frequency with wavelength lambda.

Some embodiments herein are directed to methods for detecting a first field 101. Referring to FIGS. 8-14, a method (204) for detecting a first field 101, according to an embodiment herein, includes providing (206) a chamber 102 containing a vapor comprising atoms of at least one element. The atoms may be either cooled to low temperatures using laser-cooling techniques, or they may be in thermal equilibrium with the walls of the chamber 102. The method (204) also includes providing (208) a radio-frequency circuit 104 comprising a waveguide 110. The method (204) also includes providing (210) an input signal to the radio-frequency circuit 104, wherein the input signal to the radio-frequency circuit 104 relays information relating to the first field 101. The input signal to the waveguide 110 results in a second field 116 at least within a zone of influence of the waveguide 110. The method (204) also includes arranging (212) for the waveguide to be located in relation to the chamber 102 such that at least some of the vapor and at least a portion of the second field 116 are co-located in a co-location zone 120 within the chamber 102. The method (204) also includes directing (214) one or more laser beams 122, 124 through the co-location zone 120 to excite at least some of the atoms of the at least one element in the vapor within the co-location zone 120 within the chamber 102 to one or more Rydberg states. The one or more laser beams 122, 124 include one or more probe beams 124. At least each of the one or more probe beams 124 acquires one or more deviations in one or more of their physical properties as a result of passing through the co-location zone 120 that relays information relating to the second field 116. The method (204) also includes detecting (216) at least the one or more probe beams 124 using detector means 108 configured to detect at least the one or more probe beams 124.

The radio-frequency circuit 104 includes an interface 112 for receiving an input signal having at least one component corresponding to the first field 101. The input signal to the radio-frequency circuit 104 serves as an input signal to the waveguide 110. The co-location zone 120 lies at least in part within the zone of influence of the waveguide 110. The detector means 108 comprises a photo-detection element 132 and an output port 134, and the detector means 108 is configured to produce an output signal 173 at its output port 134 that provides information corresponding to at least a portion of the information relating to the second field 116 that in turn corresponds to the information relating to the first field 101. The method (204) also includes producing (218) the output signal 173 at the output port 134 that provides information corresponding to the information relating to the first field 101. In some embodiments, the one or more probe beams 124 pass through the co-location zone 120 within the chamber 102, where at least each of the one or more probe beams 124 acquire one or more of a phase deviation and an amplitude deviation as a result of passing through the co-location zone 120 that relays information relating to the second field 116.

In some embodiments, providing (210) the input signal to the radio-frequency circuit 104 includes providing (220) an antenna 154 for interacting with the first field 101 and producing (222) an antenna signal 156 having at least one component relaying the information relating to the first field. Providing (210) the input signal to the radio-frequency circuit 104 also includes placing (224) the antenna 154 in one of a direct electrical communication and an indirect electrical communication with the interface 112 for receiving the input signal to the radio-frequency circuit 104 via an electrical communication pathway 158. The input signal to the radio-frequency circuit 104 is formed at least in part by the antenna signal 156.

In some embodiments herein, the radio-frequency circuit 104 has a bias connection 152 configured to allow a DC bias voltage to be applied to the waveguide 110 in order to help zero ambient DC fields. In some embodiments, the method further includes applying (226) a DC bias voltage to the bias connection 152 in order to help zero ambient DC fields.

In some embodiments herein, the apparatus 100 is a receiver for modulated signals, the first field 101 is a first fluctuating field having one or more frequencies in the radio frequency range, and the second field 116 is a second fluctuating field. The information relating to the first field 101 may include communication information relayed by the first fluctuating field 101. The apparatus 100 may further include a demodulation circuit 172 electrically communicating with the detector means 108 for receiving the output signal 173 from the detector means 108 and for producing an information signal 174 containing information corresponding to the communication information contained in the first fluctuating field 101 based at least in part upon the output signal 173 from the detector means 108. In some embodiments herein, the method (204) further includes demodulating (228) the output signal 173 from the detector means 108, using the demodulation circuit 172, to produce the information signal 174. The information signal 174 may contain, without limitation, one or more of audio, video, or data.

In some embodiments, providing (208) a radio-frequency circuit 104 comprises providing (230) the wave guide 110 such that the wave guide 110 comprises one or more wave guides selected from the group of waveguides consisting of waveguides comprising parallel conductive strips, parallel wire waveguides, strip lines, and dielectric resonators.

In some embodiments, the method may further include amplifying (232) the antenna signal 156 before it is communicated to the interface 112 for receiving the input signal to the radio-frequency circuit 104.

In some embodiments, the method may further include performing (234) electromagnetically-induced-transparency spectroscopy using the one or more probe beams 124 to acquire the information relating to the second field 116 and in turn the information relating to the first field 101. Electromagnetically induced transparency is a well-established spectroscopy technique used to measure the resonance frequency of an atomic transition. The method uses two or more optical fields that counter-propagate or co-propagate through the atomic sample. Spectroscopic information about the atomic state is transferred into either the phase or amplitude of the transmitted beams, which are subsequently detected on a photodetector or photo-sensor. The optical heterodyne detection scheme of FIG. 1 is one implementation of electromagnetically-induced-transparency spectroscopy. As the general electromagnetically-induced-transparency spectroscopy is a well-established technique, no further details of such general spectroscopy techniques beyond what has already been provided is needed herein. As detection schemes other than the optical heterodyne detection scheme of FIG. 1 may be used with some embodiments herein, so too other spectroscopy techniques could be used in some of the embodiments herein.

Some embodiments herein, may employ one, two, or three laser beams in total that include the one or more probe beams 124. In the embodiments herein, the radio-frequency circuit 104 and the waveguide 110 may be positioned inside the chamber 102 or outside the chamber 102 or integrated into the walls, for example the bottom wall, of the chamber 102. In the embodiments herein, one or more of the antenna, amplifiers, RF mixers, and local oscillators may reside on the same substrate as the radio-frequency circuit 104.

The embodiments disclosed herein may be carried out at ordinary temperatures without the need for cryogenic cooling. Some embodiments disclosed herein may employ laser cooling of the atoms that are coupled or are to be coupled to the fields produced by the waveguides in the radio-frequency circuits of the embodiments disclosed herein.

The foregoing description of the specific embodiments will so fully reveal the general nature of the embodiments herein that others may, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein may be practiced with modification within the spirit and scope of the appended claims.

What is claimed is:

1. An apparatus for detecting a first field, the apparatus comprising:
 a chamber configured to contain a vapor comprising atoms of at least one element;
 a radio-frequency circuit comprising a waveguide, the radio-frequency circuit including an interface for receiving an input signal having at least one component corresponding to the first field, wherein the input signal to the radio-frequency circuit relays information relating to the first field, wherein the input signal to the radio-frequency circuit results in a second field emitted from the waveguide, wherein the waveguide is located in relation to the chamber such that at least some of the vapor and at least a portion of the second field are co-located in a co-location zone within the chamber when the chamber is charged with the vapor;
 one or more lasers configured to provide one or more laser beams during operation of the apparatus, the one or more laser beams being configured to provide atomic excitation of at least some of the atoms of the at least one element in the vapor within the co-location zone within the chamber to one or more Rydberg states during operation of the apparatus, the one or more laser beams being further configured to provide one or more probe beams passing through the co-location zone within the chamber, at least each of the one or more probe beams acquiring one or more deviations in one or more of its physical characteristics as a result of passing through the co-location zone during operation of the apparatus that relays information relating to the second field; and one or more photo-sensors configured to detect at least the one or more probe beams and for providing a photo-detection output signal at a photo-detection output port that provides information corresponding to at least a portion of the information relating to the second field that in turn corresponds to at least a portion of the information relating to the first field during operation of the apparatus.

2. The apparatus according to claim 1, wherein the chamber has one or more transparent portions to allow the one or more laser beams to traverse the co-location zone within the chamber.

3. The apparatus according to claim 1, wherein the one or more laser beams each have a wavelength in a range from 400 nm to 1600 nm.

4. The apparatus according to claim 1, wherein the vapor is an atomic vapor of at least the atoms of the at least one element, and wherein the at least one element is selected from the group consisting of rubidium and cesium.

5. The apparatus according to claim 1, wherein the wave guide comprises one or more wave guides selected from the group of waveguides consisting of waveguides comprising parallel conductive strips, parallel wire waveguides, strip lines, and dielectric resonators.

6. The apparatus according to claim 1, wherein the waveguide comprises:
   a substrate;
   a first conductive strip provided on the substrate and having a length; and
   a second conductive strip provided on the substrate and having a length,
   wherein there is a gap between the first conductive strip and the second conductive strip, wherein at least an edge of the first conductive strip on a first side of the gap is parallel to at least an edge of the second conductive strip on a second side of the gap, which is opposite the first side of the gap, over at least a portion of the length of the first conductive strip and at least a portion of the length of the second conductive strip,
   wherein the first conductive strip serves as a signal trace and the second conductive strip serves as a ground plane, and wherein the atoms excited to the one or more Rydberg states are generated within the co-location zone located in proximity to the gap between the first conductive strip and the second conductive strip.

7. The apparatus according to claim 6, wherein the interface for receiving the input signal to the radio-frequency circuit has a signal connection and a ground connection, and wherein the first conductive strip is conductively connected to the signal connection of the interface for receiving the input signal to the radio-frequency circuit and the second conductive strip is conductively connected to the ground connection of the interface for receiving the input signal to the radio-frequency circuit.

8. The apparatus according to claim 6, wherein the gap between the first conductive strip and the second conductive strip is from 1 μm to 20 mm.

9. The apparatus according to claim 6, wherein the gap between the first conductive strip and the second conductive strip is from 100 μm to 5 mm.

10. The apparatus according to claim 6, wherein the apparatus further comprises a substrate bias connection configured to allow a DC bias voltage to be applied to the substrate in order to help zero ambient DC fields.

11. The apparatus according to claim 6, further comprising an antenna for interacting with the first field and producing an antenna signal having at least one component relaying the information relating to the first field, wherein the antenna is in one of direct electrical communication and indirect electrical communication with the interface for receiving the input signal to the radio-frequency circuit via an electrical communication pathway, and wherein the input signal to the radio-frequency circuit is formed at least in part by the antenna signal.

12. The apparatus according to claim 11, further comprising a preamplifier provided in the electrical communication pathway between the antenna and the interface for receiving the input signal to the radio-frequency circuit for strengthening the antenna signal before it is communicated to the interface for receiving the input signal to the radio-frequency circuit, the preamplifier having at least one input for receiving the antenna signal and at least one output for outputting a preamplifier output signal, wherein the preamplifier output signal provides at least a part of the input signal to the radio-frequency circuit.

13. The apparatus according to claim 12, further comprising a local oscillator providing a local oscillator signal, the local oscillator being electrically connected to the electrical communication pathway between the preamplifier and the interface for receiving the input signal to the radio-frequency circuit such that the preamplifier output signal is mixed with the local oscillator signal to provide at least a part of the input signal to the radio-frequency circuit for enhancing the sensitivity of the apparatus for detecting the information relating to the first field.

14. The apparatus according to claim 13, wherein the apparatus is a receiver for a modulated signal, wherein the first field is a first fluctuating field having one or more frequencies in the radio frequency range, wherein the second field is a second fluctuating field, wherein the information relating to the first field includes communication information relayed by the first fluctuating field, and wherein the apparatus further comprises a demodulation circuit electrically communicating with the photo-detection output port for receiving the photo-detection output signal and for producing an information signal containing information corresponding to the communication information contained in the first fluctuating field based at least in part upon the photo-detection output signal.

15. The apparatus according to claim 13, wherein the local oscillator signal has a frequency, wherein the local oscillator is configured such that the local oscillator signal frequency is capable of being scanned from 0 Hz up to 100 GHz, wherein the local oscillator is used to boost detection within a frequency range around the local oscillator signal frequency, and wherein the local oscillator signal frequency is scanned such that the apparatus may perform continuous spectrum analysis from 0 Hz up to 40 GHz.

16. The apparatus according to claim 1, wherein the apparatus is capable of being used a receiver that surpasses a thermal noise limit, by performing atomic spectroscopy below the thermal noise limit.

17. The apparatus according to claim 1, wherein the apparatus has a bandwidth that is not limited by a Chu limit.

18. The apparatus according to claim 1, wherein the apparatus is capable of providing spectral awareness in the radio-frequency spectrum for frequencies ranging from 0 Hz to 40 GHz.

19. A method for detecting a first field, the method comprising:
provinding a chamber containing a vapor comprising atoms of at least one element;
providing a radio-frequency circuit comprising a waveguide, the radio-frequency circuit including an interface for receiving an input signal having at least one component corresponding to the first field, wherein the input signal to the radio-frequency circuit serves as an input signal to the waveguide, wherein input signal to the waveguide results in a second field emitted from the waveguide;
providing the input signal to the radio-frequency circuit, wherein the input signal to the radio-frequency circuit relays information relating to the first field;
arranging for the waveguide to be located in relation to the chamber such that at least some of the vapor and at least a portion of the second field are co-located in a co-location zone within the chamber;
directing one or more laser beams through the co-location zone to excite at least some of the atoms of the at least one element in the vapor within the co-location zone within the chamber to one or more Rydberg states, the one or more laser beams comprising one or more probe beams, the one or more probe beams passing through the co-location zone within the chamber, at least each of the one or more probe beams acquiring one or more deviations in one or more of its physical characteristics as a result of passing through the co-location zone that relays information relating to the second field;
detecting at least the one or more probe beams using one or more photo-sensors configured to detect at least the one or more probe beams and for producing a photo-detection output signal at a photo-detection output port that provides information corresponding to at least a portion of the information relating to the second field that in turn corresponds to the information relating to the first field; and
producing the output signal at the output port that provides information corresponding to the information relating to the first field.

20. The method according to claim 19, wherein providing the input signal to the radio-frequency circuit comprises:
providing an antenna for interacting with the first field and producing an antenna signal having at least one component relaying the information relating to the first field; and
placing the antenna in one of a direct electrical communication and an indirect electrical communication with the interface for receiving the input signal to the radio-frequency circuit via an electrical communication pathway, wherein the input signal to the radio-frequency circuit is formed at least in part by the antenna signal.

21. The method according to claim 20, wherein the radio-frequency circuit has a bias connection configured to allow a DC bias voltage to be applied to the waveguide in order to help zero ambient DC fields, the method further comprising:
applying a DC bias voltage to the bias connection in order to help zero ambient DC fields.

22. The method according to claim 20, wherein the apparatus is a receiver for a modulated signal, wherein the first field is a first fluctuating field having one or more frequencies in the radio frequency range, wherein the second field is a second fluctuating field, wherein the information relating to the first field includes communication information relayed by the first fluctuating field, and wherein the apparatus further comprises a demodulation circuit electrically communicating with the photo-detection output port for receiving the photo-detection output signal and for producing an information signal containing information corresponding to the communication information contained in the first fluctuating field based at least in part upon the photo-detection output signal, the method further comprising:
demodulating the photo-detection output signal, using the demodulation circuit, to produce the information signal.

23. The method according to claim 19, wherein providing a radio-frequency circuit comprises:
providing the wave guide such that the wave guide comprises one or more wave guides selected from the group of waveguides consisting of waveguides comprising parallel conductive strips or plates, parallel wire waveguides, strip lines, hollow waveguides, and dielectric resonators.

24. The method according to claim 20, further comprising:
amplifying the antenna signal before it is communicated to the interface for receiving the input signal to the radio-frequency circuit.

25. The method according to claim 19, the method further comprising:
performing electromagnetically-induced-transparency spectroscopy using the one or more probe beams to acquire the information relating to the second field.

* * * * *